(12) United States Patent
Kaji et al.

(10) Patent No.: US 11,031,355 B2
(45) Date of Patent: Jun. 8, 2021

(54) SEMICONDUCTOR DEVICE

(71) Applicant: Mitsubishi Electric Corporation, Chiyoda-ku (JP)

(72) Inventors: Yusuke Kaji, Chiyoda-ku (JP); Kozo Harada, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 1 day.

(21) Appl. No.: 16/611,001

(22) PCT Filed: Mar. 8, 2018

(86) PCT No.: PCT/JP2018/008938
§ 371 (c)(1),
(2) Date: Nov. 5, 2019

(87) PCT Pub. No.: WO2019/008828
PCT Pub. Date: Jan. 10, 2019

(65) Prior Publication Data
US 2020/0286840 A1 Sep. 10, 2020

(30) Foreign Application Priority Data

Jul. 3, 2017 (JP) .............................. JP2017-130221

(51) Int. Cl.
*H01L 23/053* (2006.01)
*H01L 23/373* (2006.01)
(Continued)

(52) U.S. Cl.
CPC .......... *H01L 23/562* (2013.01); *H01L 23/053* (2013.01); *H01L 23/293* (2013.01);
(Continued)

(58) Field of Classification Search
CPC ................. H01L 23/053; H01L 25/072; H01L 2224/48137; H01L 2924/0665; H01L 23/3142
See application file for complete search history.

(56) References Cited

U.S. PATENT DOCUMENTS

| 6,421,224 | B1 * | 7/2002 | Lin | ..................... H01L 27/0805 257/347 |
| 2016/0071778 | A1 * | 3/2016 | Otsubo | ................... H01L 21/52 257/687 |
| 2016/0300770 | A1 * | 10/2016 | Taya | ....................... H01L 24/84 |

FOREIGN PATENT DOCUMENTS

| JP | 2007-184315 A | 7/2007 |
| JP | 2009-16884 A | 1/2009 |

(Continued)

OTHER PUBLICATIONS

International Search Report dated May 22, 2018 in PCT/JP2018/008938 filed Mar. 8, 2018.

*Primary Examiner* — Dale E Page
*Assistant Examiner* — Wilner Jean Baptiste
(74) *Attorney, Agent, or Firm* — Xsensus LLP (57) ABSTRACT

A semiconductor device includes an insulating substrate having a main surface, a semiconductor element, a case member, and a sealing resin as a sealing material. The case member includes a recess that is continuous with a connection portion of the case member connected to the insulating substrate, and that faces the internal region. The recess includes a facing surface as an inner wall portion facing the main surface of the insulating substrate. A distance from the main surface of the insulating substrate to the facing surface as the inner wall portion is greater than a distance from the main surface to an upper surface of the semiconductor element.

10 Claims, 7 Drawing Sheets

(51) Int. Cl.
  *H01L 25/07* (2006.01)
  *H01L 23/00* (2006.01)
  *H01L 23/29* (2006.01)
  *H01L 23/31* (2006.01)

(52) U.S. Cl.
  CPC ........ *H01L 23/296* (2013.01); *H01L 23/3121* (2013.01); *H01L 23/3735* (2013.01); *H01L 24/48* (2013.01); *H01L 24/73* (2013.01); *H01L 25/072* (2013.01); *H01L 2224/48137* (2013.01); *H01L 2224/48155* (2013.01); *H01L 2224/48472* (2013.01); *H01L 2224/73265* (2013.01); *H01L 2924/0665* (2013.01); *H01L 2924/0715* (2013.01); *H01L 2924/35121* (2013.01)

(56) References Cited

FOREIGN PATENT DOCUMENTS

| | | |
|---|---|---|
| JP | 2015-46476 A | 3/2015 |
| JP | 2015-162649 A | 9/2015 |
| JP | 2016-58563 A | 4/2016 |
| WO | WO 2016/121456 A1 | 8/2016 |

\* cited by examiner

SEMICONDUCTOR DEVICE

TECHNICAL FIELD

The present invention relates to a semiconductor device in which a semiconductor element disposed on an insulating substrate is sealed with a sealing resin.

BACKGROUND ART

There is a need for semiconductor devices such as inverter devices mounted on industrial equipment and automobiles to have higher density and smaller size. This need has led to increasing packaging density of semiconductor elements packaged on those semiconductor devices. In a semiconductor device having a high packaging density of semiconductor elements, an exposed area of an insulating substrate on which the semiconductor elements are packaged is relatively small. As a result, the area of adhesion between a sealing material that protects the semiconductor elements and the insulating substrate tends to be small. The small area of adhesion may cause peeling between the sealing material and the insulating substrate due to stress caused by high temperature storage or a heat cycle in the semiconductor device. There is a risk that such peeling between the sealing material and the insulating substrate may reduce insulation of the semiconductor device, resulting in reduced reliability of the semiconductor device.

In order to suppress peeling between a sealing material and an insulating substrate or the like from the viewpoint of ensuring reliability of a semiconductor device, in PTL 1, in a surface of a copper base to which a ceramic substrate as an insulating substrate is joined, two or more rows of grooves are formed around the ceramic substrate. In PTL 1, epoxy resin as a sealing material is transfer molded to fill the grooves with some of the epoxy resin, to thereby improve adhesion between the sealing material and the copper base.

PTL 2 discloses a semiconductor device in which a semiconductor element is disposed in a cavity of a ceramic case, and the inside of the cavity is sealed with a sealing material, the cavity having a recess formed at a lower portion of its sidewall. In the semiconductor device of PTL 2, the recess at the lower portion of the sidewall is provided with a facing surface facing a bottom surface. The facing surface of the recess is disposed between an upper surface height position and a lower surface height position of the semiconductor element. In the semiconductor device of PTL 2, a stress directed upward from the cavity bottom surface and a stress directed toward the cavity bottom surface from an upper portion of the sidewall, which are generated upon application of heat to the semiconductor element, cancel each other out. As a result, according to PTL 2, a compound stress directed upward from the cavity bottom surface is reduced, and deformation of the semiconductor element due to the compound stress can be suppressed.

CITATION LIST

Patent Literature

PTL 1: Japanese Patent Laying-Open No. 2007-184315
PTL 2: Japanese Patent Laying-Open No. 2009-16884

SUMMARY OF INVENTION

Technical Problem

Although the method disclosed in PTL 1 can produce the effect of anchoring the sealing material with respect to the copper base because of the grooves provided in the copper base, peeling between the ceramic substrate and the sealing material cannot be directly suppressed. Further, it is necessary to secure a region for forming the grooves in the surface of the copper base, which inhibits size reduction of the semiconductor device. Since the semiconductor device described in PTL 1 is a transfer molding type semiconductor device, the grooves can be provided in the copper base surface located at an end portion of the semiconductor device. In a case type module, however, a case member is connected to the outer periphery of an insulating substrate, and therefore, it may be difficult to form grooves in a surface of the insulating substrate due to space limitations and the like.

In the semiconductor device described in PTL 2, the facing surface of the recess needs to be disposed between the upper surface height position and the lower surface height position of the semiconductor element in order to suppress the deformation of the semiconductor element. However, when mounting a semiconductor element, which has been reduced in size and also in thickness, on a circuit board on an insulating substrate using a joining material, the height from the insulating substrate to the facing surface is extremely low. In this case, it is difficult to fill the recess with the sealing material, and a void may be formed at the boundary between the sealing material and the insulating substrate in the vicinity of the recess. As a result, reliability of the semiconductor device may not be ensured.

The present invention has been made to solve the above-described problem, and an object thereof is to provide a semiconductor device capable of being reduced in size and having high reliability.

Solution to Problem

A semiconductor device according to the present disclosure includes: an insulating substrate having a main surface; a semiconductor element; a case member; and a sealing material. The semiconductor element is disposed on the main surface of the insulating substrate. The case member surrounds the semiconductor element, and is connected to the insulating substrate. The sealing material is disposed in an internal region surrounded by the case member and the insulating substrate, and surrounds the semiconductor element. The case member includes a recess that is continuous with a connection portion of the case member connected to the insulating substrate, and that faces the internal region. The recess includes an inner wall portion facing the main surface of the insulating substrate. A distance from the main surface of the insulating substrate to the inner wall portion is greater than a distance from the main surface to an upper surface of the semiconductor element.

Advantageous Effects of Invention

According to the semiconductor device, the case member is provided with the recess that is continuous with the connection portion between the case member and the insulating substrate and that has a sufficient size in the semiconductor device having an increased packaging density of semiconductor elements and reduced in size. Therefore, the recess can be reliably filled with the sealing material, to increase the area of joint between the sealing material and the insulating substrate as compared to an example where the recess is not provided. Thus, the joint strength between the sealing material and the insulating substrate can be improved to increase resistance to thermal stress in the semiconductor device reduced in size. As a result, the semiconductor device reduced in size and having high reliability can be obtained.

DESCRIPTION OF EMBODIMENTS

Embodiments of the present invention will be described hereinafter based on the drawings. In the following drawings, the same or corresponding components are denoted by the same reference numerals, and a description thereof will not be repeated.

First Embodiment

<Configuration of Semiconductor Device>

Figure 1:
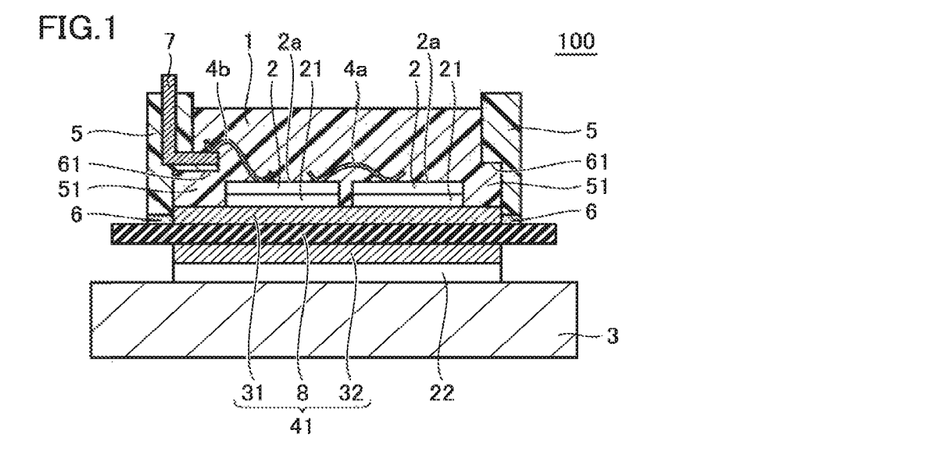
FIG. 1 is a schematic cross-sectional view of a semiconductor device according to a first embodiment of the present invention.
Figure 2:
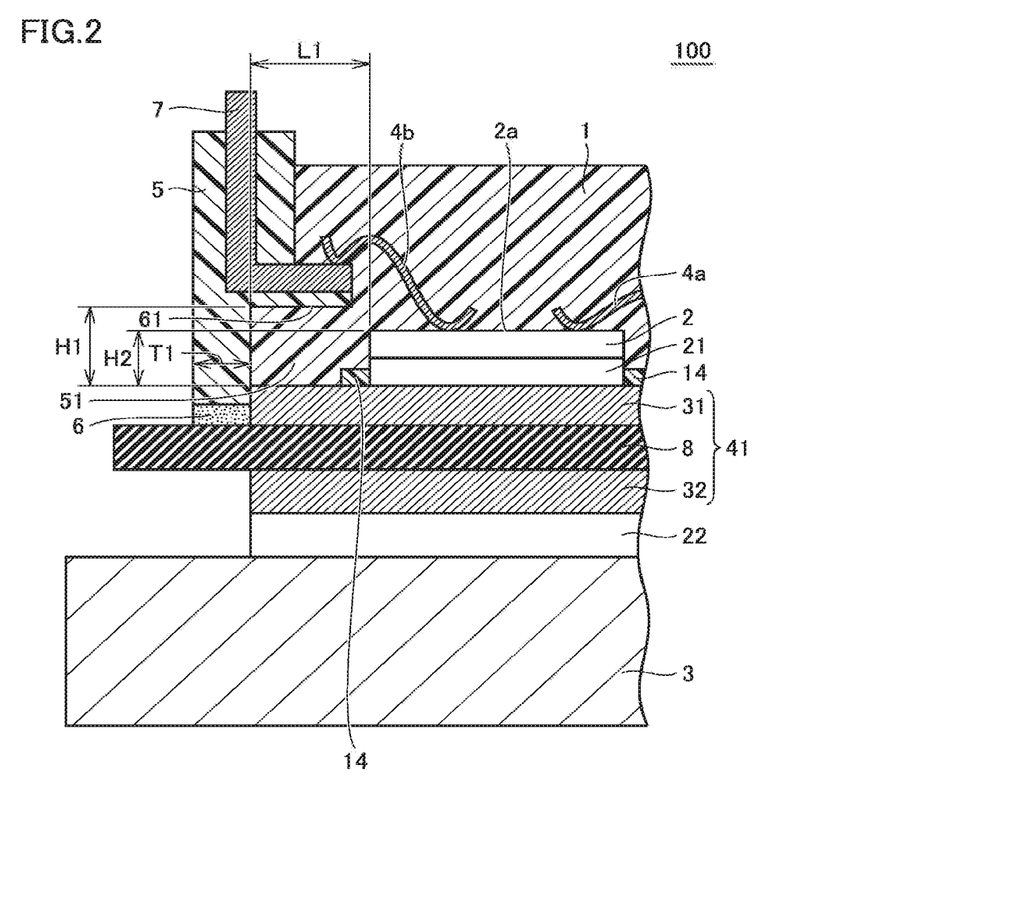
FIG. 2 is a schematic fragmentary cross-sectional view of the semiconductor device shown in FIG. 1.

FIG. 1 is a schematic cross-sectional view showing a basic structure of a semiconductor device according to a first embodiment of the present invention. FIG. 2 is a schematic fragmentary cross-sectional view of the semiconductor device shown in FIG. 1. The configuration of the semiconductor device according to the first embodiment of the present invention is described with reference to FIGS. 1 and 2. A semiconductor device 100 shown in FIGS. 1 and 2 is a semiconductor power module used for industrial purposes or for automobiles, for example.

Referring to FIG. 1, semiconductor device 100 mainly includes an insulating substrate 41, a metal base plate 3, semiconductor elements 2 joined on insulating substrate 41, wiring members 4a, 4b, a case member 5 surrounding semiconductor elements 2, an electrode terminal 7, and a sealing resin 1. Case member 5 is connected to insulating substrate 41 by an adhesive 6. Case member 5 is provided with a recess 51 on its inner surface at its end portion on the insulating substrate 41 side. Recess 51 is filled with the sealing resin. Insulating substrate 41 includes an insulating layer 8 having a front surface and a back surface, a first circuit board 31 disposed on the front surface of insulating layer 8, and a second circuit board 32 disposed on the back surface of insulating layer 8. Insulating layer 8 has a greater width than first circuit board 31 and second circuit board 32. Therefore, insulating layer 8 has ends extending outward relative to the ends of first circuit board 31 and the ends of second circuit board 32.

Semiconductor element 2 is disposed on insulating substrate 41. Semiconductor element 2 is connected to first circuit board 31 of insulating substrate 41 by a first joining material 21. Insulating substrate 41 is disposed on metal base plate 3. Metal base plate 3 and insulating substrate 41 are connected to each other by a second joining material 22.

Case member 5 is joined on insulating layer 8 of insulating substrate 41 with adhesive 6 interposed therebetween. Adhesive 6 may be disposed in contact with case member 5, insulating layer 8 and first circuit board 31 as shown in FIG. 2. Two semiconductor elements 2 are connected to each other using wiring member 4a. One of semiconductor elements 2 is connected to electrode terminal 7 using wiring member 4b. Electrode terminal 7 is formed integrally with case member 5. One end portion of electrode terminal 7 is a connection portion connected to wiring member 4b. Electrode terminal 7 is disposed to extend through case member 5 from the one end portion exposed at an inner peripheral surface side of case member 5 and protrude above case member 5. The connection portion of electrode terminal 7 connected to wiring member 4b is a first portion extending in a direction along a surface of first circuit board 31. Electrode terminal 7 also includes a second portion extending in a vertical direction intersecting the first portion. The second portion includes a portion extending through case member 5 and protruding above case member 5.

When viewed from above the surface of first circuit board 31, case member 5 has a quadrangular shape, for example, so as to surround semiconductor elements 2. An inner peripheral surface of recess 51 provided in case member 5 is composed of a surface of case member 5 and the surface of first circuit board 31. Recess 51 is filled with sealing resin 1. Recess 51 has a facing surface 61, which faces first circuit board 31, located higher than an upper surface 2a of semiconductor element 2. Namely, a distance H1 from the surface of first circuit board 31 to facing surface 61 is greater than a distance H2 from the surface of first circuit board 31 to upper surface 2a of semiconductor element 2.

Distance H1 from first circuit board 31 to facing surface 61 facing first circuit board 31 may be set to not less than 0.5 mm and not more than 10 mm, for example. If distance H1 is less than 0.5 mm, there is no sufficient space in recess 51 to be filled with sealing resin 1, possibly resulting in difficulty in the filling of sealing resin 1. If distance H1 is more than 10 mm, on the other hand, semiconductor device 100 is increased in size.

A thickness T1 of case member 5 located outside of recess 51 is preferably set to a certain thickness so as to maintain the strength of case member 5. For example, thickness T1 may be set to not less than 1 mm and not more than 20 mm. If thickness T1 is less than 1 mm, the strength of case member 5 may not be sufficient. If thickness T1 is more than 20 mm, on the other hand, the area on the inner peripheral side of case member 5, namely, the mounting area of semiconductor elements 2, decreases when case member 5 has a constant outer periphery size.

Semiconductor element 2 may be, for example, an IGBT (Insulated Gate Bipolar Transistor) for high-speed switching of a large amount of current, or a reflux diode provided in parallel to the semiconductor element. Examples of a material for semiconductor element 2 that can be used include not only silicon (Si), but also so-called wide band gap semiconductors having wider band gaps than silicon. Examples of a wide band gap semiconductor that can be used include: compound semiconductors such as silicon carbide (SiC), gallium nitride (GaN); or diamond. The number of semiconductor elements 2 may be one, or three or more, without being limited to two as shown in FIG. 1. The number of semiconductor elements 2 may be any required number depending on the intended use of the semiconductor device.

Although copper is normally used as a material for each of first circuit board 31, second circuit board 32 and electrode terminal 7, the material is not limited to this. The material for them is not particularly limited as long as the material has necessary heat dissipation property. For example, aluminum (Al), iron (Fe), or an alloy of aluminum and iron may be used as this material. Alternatively, a composite material such as a multilayer material made up of different materials such as copper-invar-copper may be used. Further, an alloy such as an aluminum-silicon carbide alloy (AlSiC) or a copper-molybdenum alloy (CuMo) may be used.

A plated layer such as a nickel (Ni) plated layer is normally formed on the surfaces of first circuit board 31 and electrode terminal 7. However, the plated layer may be or may not be formed on the surfaces as long as necessary current and voltage can be supplied to semiconductor element 2. When forming a plated layer, a gold plated layer or a tin plated layer may be formed, for example, in addition to the nickel plated layer.

On the surface of first circuit board 31, a positioning member 14 for defining a position where first joining material 21 is mounted is normally disposed as shown in FIG. 2. A resist material may be applied, for example, as positioning member 14. Polyimide may be used as a material for positioning member 14, as long as the position where first joining material 21 is mounted can be defined. Alternatively, above-described positioning member 14 may not be disposed.

As insulating layer 8, a substrate made of an insulating material composed of ceramic such as alumina ($Al_2O_3$), aluminum nitride (AlN), silicon nitride ($Si_3N_4$) is normally used. The material for insulating layer 8 is not limited to the above-described materials, but may be silicon dioxide ($SiO_2$), boron nitride (BN) or the like. Insulating layer 8 is not limited to the substrate made of ceramic, but may be a resin insulating substrate formed by curing a resin in which ceramic powders are dispersed. In insulating substrate 41, insulating layer 8 has first circuit board 31 bonded to its one surface, and second circuit board 32 bonded to its back surface, which is the other surface. Any method can be employed for bonding first circuit board 31 and second circuit board 32 to insulating layer 8.

In the resin insulating substrate formed by curing a resin in which ceramic powders are dispersed, which is used as insulating layer 8, alumina ($Al_2O_3$), silicon dioxide ($SiO_2$), aluminum nitride (AlN), boron nitride (BN), silicon nitride ($Si_3N_4$) or the like can be used as the ceramic powders. The material for the ceramic powders is not limited to the above-described materials. For example, diamond (C), silicon carbide (SiC), or boron oxide ($B_2O_3$) may be used.

As the powders to be dispersed in the resin insulating substrate as insulating layer 8, powders made of resin such as silicone resin or acrylic resin may be used, for example, in addition to the ceramic powders. The powders may have a spherical shape or another shape. For example, the powders may have a pulverized shape in which a bulk material was merely pulverized (granular shape), a grain-like shape, or a scale shape. Alternatively, an aggregate in which a plurality of unit powders are aggregated may be used as the powders. An amount of the provided powders in the insulating resin substrate as insulating layer 8 may be such that required heat dissipation property and insulation property are obtained. Although epoxy resin is normally used as a material for the resin forming the resin insulating substrate, the material is not limited to this. For example, polyimide resin, silicone resin, or acrylic resin may be used as the material for the resin. Any resin may be used as long as the resin has both insulation property and adhesive property.

Although a metal such as copper (Cu) or aluminum (Al) is normally used as a material for metal base plate 3, the material is not limited to this. For example, an alloy such as an aluminum-silicon carbide alloy (AlSiC) or a copper-molybdenum alloy (CuMo) may be used as the material for metal base plate 3. Alternatively, an organic material such as epoxy resin, polyimide resin or acrylic resin may be used as the material for metal base plate 3.

Although a wire made of metal such as aluminum and having a circular cross-sectional shape is used as wiring members 4a, 4b, for example, wiring members 4a, 4b are not limited to this. A strip body obtained by shaping copper or aluminum (Al) into a strip may be used as wiring members 4a, 4b. A wire having a circular cross-sectional shape and a strip body may be combined for use as wiring members 4a, 4b. Although FIGS. 1 and 2 show a structure in which one or two wiring members 4a, 4b are connected to one semiconductor element 2, this illustration of FIGS. 1 and 2 shows a simplified connection state between wiring members 4a, 4b and semiconductor element 2. In actual semiconductor device 100, a required number of wiring members 4a, 4b may be provided depending on conditions such as current density of semiconductor element 2 and operating temperature of semiconductor device 100.

Although LCP (Liquid Crystal Polymer), PPS (PolyPhenylene Sulfied) are mainly used as a material for case member 5, the material is not limited to this. A thermoplastic material such as PBT (PolyButylene Terephthalate) may be used as the material for case member 5. Any material can be employed as the material for case member 5 as long as the material is heat-resistant and has good moldability.

Although epoxy resin is used as a material for sealing resin 1, for example, the material is not limited to this. The material for sealing resin 1 may be any material having a desired elastic modulus, heat resistance and adhesive property. For example, silicone resin, urethane resin, polyimide resin, polyamide resin, or acrylic resin may be used as the material for sealing resin 1.

<Functions and Effects>

Above-described semiconductor device 100 includes insulating substrate 41 having a main surface, semiconductor element 2, case member 5, and sealing resin 1 as a sealing material. Semiconductor element 2 is disposed on the main surface of insulating substrate 41. Case member 5 surrounds semiconductor element 2, and is connected to insulating substrate 41. Sealing resin 1 is disposed in an internal region surrounded by case member 5 and insulating substrate 41, and surrounds semiconductor element 2. Case member 5 includes recess 51 that is continuous with a connection portion of case member 5 connected to insulating substrate 41, and that faces the internal region. Recess 51 includes facing surface 61 as an inner wall portion facing the main surface of insulating substrate 41. Distance H1 from the main surface of insulating substrate 41 (an upper surface of first circuit board 31) to facing surface 61 as the inner wall portion is greater than distance H2 from the main surface to upper surface 2a of semiconductor element 2. In other words, as shown in FIGS. 1 and 2, insulating substrate 41 is mounted on metal base plate 3 in semiconductor device 100 of the present embodiment. Semiconductor element 2 is mounted on insulating substrate 41. Case member 5 is provided to surround semiconductor element 2. In such semiconductor device 100, a bottom surface of case member 5 is provided with recess 51 having facing surface 61 located higher than upper surface 2a of semiconductor element 2.

In such semiconductor device 100, since recess 51 is formed in case member 5 so as to face semiconductor element 2 as described above, the area of adhesion between sealing resin 1 and first circuit board 31 in the vicinity of semiconductor element 2 can be increased. Accordingly, the possibility of peeling between insulating substrate 41 and sealing resin 1 due to thermal stress can be reduced, and the reliability of semiconductor device 100 with respect to thermal stress can be improved.

In above-described semiconductor device 100, facing surface 61 as the inner wall portion is parallel to the main surface of insulating substrate 41, specifically, the surface of first circuit board 31. In this case, recess 51 can be sufficiently increased in volume as compared to an example where facing surface 61 is inclined relative to this surface. Therefore, recess 51 can be sufficiently filled with sealing resin 1.

In above-described semiconductor device 100, case member 5 is provided with recess 51 in a region having the shortest distance to semiconductor element 2. In this case, recess 51 can be disposed at a position relatively close to semiconductor element 2. Thus, the area of adhesion between insulating substrate 41 and sealing resin 1 can be increased in recess 51 to enhance the adhesiveness between sealing resin 1 and insulating substrate 41 at the position close to semiconductor element 2. Therefore, the possibility of damage to semiconductor element 2 due to peeling of sealing resin 1 from insulating substrate 41 can be reduced.

In above-described semiconductor device 100, case member 5 is fixed to insulating substrate 41. In this case, sealing resin 1 is fixed to case member 5 as well. Therefore, sealing resin 1 can be fixed to insulating substrate 41 via case member 5. As a result, the possibility of peeling of sealing resin 1 from insulating substrate 41 can be reduced.

In above-described semiconductor device 100, sealing resin 1 includes epoxy resin or silicone resin. In this case, semiconductor element 2 can be reliably sealed with sealing resin 1.

Figure 3:
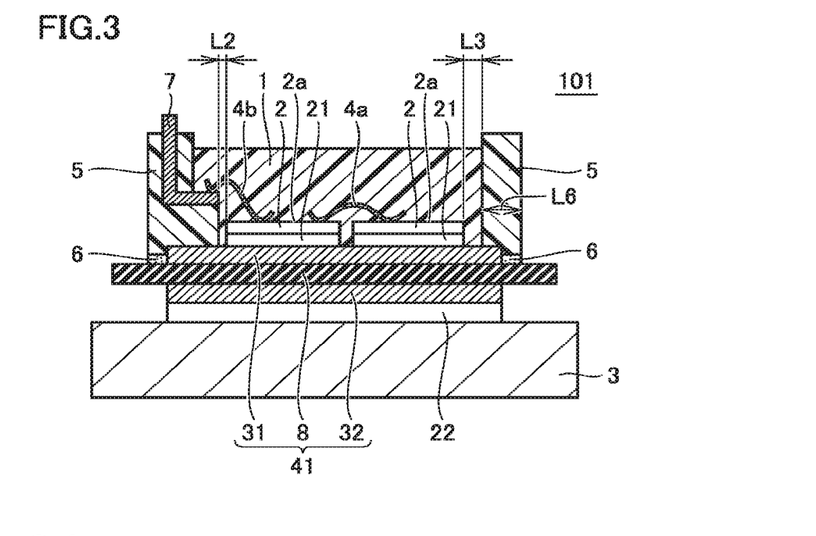
FIG. 3 is a schematic cross-sectional view of a semiconductor device according to a comparative example of the present invention.
Figure 4:
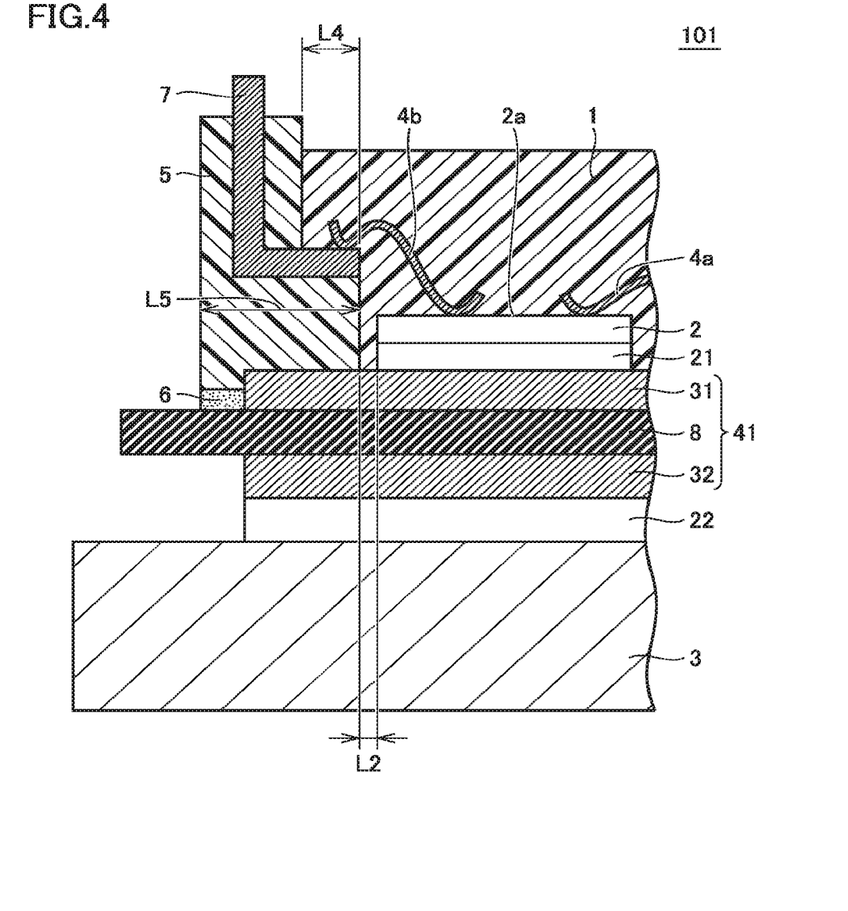
FIG. 4 is a schematic fragmentary cross-sectional view of the semiconductor device shown in FIG. 3.

Here, the reason that the reliability with respect to thermal stress can be improved in semiconductor device 100 of the present embodiment is described with reference to a semiconductor device 101 in a comparative example. FIG. 3 is a schematic cross-sectional view of semiconductor device 101 in the comparative example of the present invention. FIG. 4 is a schematic fragmentary cross-sectional view of semiconductor device 101 shown in FIG. 3. Semiconductor device 101 as the comparative example shown in FIGS. 3 and 4 is basically configured similarly to semiconductor device 100 shown in FIG. 1, but is different from semiconductor device 100 shown in FIG. 1 in that case member 5 is not provided with recess 51 (see FIG. 1).

In semiconductor device 101 as the comparative example shown in FIG. 3, a distance L2 between the end of semiconductor element 2 mounted on insulating substrate 41 and the inner wall of case member 5 is smaller than a distance L1 between the end of semiconductor element 2 and the inner wall of case member 5 in semiconductor device 100 shown in FIG. 1. A distance L3 between the end of the other semiconductor element 2 and the inner wall of case member 5 in FIG. 3 is also smaller than the distance of a corresponding portion in FIG. 1.

As can be seen from FIG. 3, distance L2 is a distance between the inner wall of case member 5 at a side of case member 5 having electrode terminal 7 and the end of semiconductor element 2. This distance L2 is considerably smaller than corresponding distance L1 in FIG. 1. Electrode terminal 7 is electrically connected to semiconductor element 2 using wiring member 4b. To connect wiring member 4b to electrode terminal 7, a large width L4 of protrusion of electrode terminal 7 from case member 5 (see FIG. 4) needs to be provided in order to prevent a wiring device such as a wire bonder from interfering with case member 5. Accordingly, a thickness L5 of case member 5 at the side having electrode terminal 7 (see FIG. 4) is greater than a thickness L6 of case member 5 without electrode terminal 7 (see FIG. 3). Therefore, distance L2 tends to be particularly small.

Figure 5:
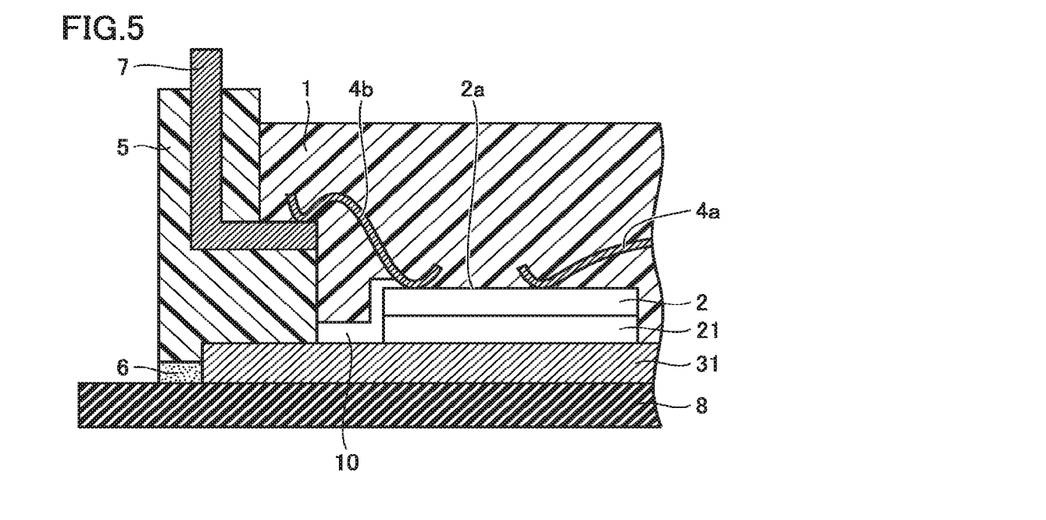
FIG. 5 is a schematic cross-sectional view showing a peeled sealing material in the semiconductor device according to the comparative example shown in FIG. 3.

Small distance L2 causes a reduction in the area of adhesion between sealing resin 1 and first circuit board 31 in a region between semiconductor element 2 and case member 5 in the vicinity of semiconductor element 2. When the area of adhesion is reduced, the adhesive force between sealing resin 1 and first circuit board 31 cannot endure thermal stress upon application of the thermal stress. As a result, a peeled portion 10 as shown in FIG. 5 is generated. FIG. 5 is a schematic cross-sectional view showing peeled sealing resin 1 from first circuit board 31 in semiconductor device 101 shown in FIG. 3. Such peeling normally occurs from the end of first circuit board 31. In semiconductor device 101 shown in FIGS. 3 and 4, the peeling progresses due to thermal stress because of small distance L2 (see FIG. 4), and reaches semiconductor element 2 and first joining material 21 as shown in FIG. 5. The progress of the peeling to this portion involves a risk of reduced insulation reliability, and the occurrence of cracks in first joining material 21 due to thermal stress.

In contrast to the comparative example shown in FIGS. 3 to 5, in semiconductor device 100 shown in FIGS. 1 and 2, recess 51 is formed on the inner side of case member 5. Therefore, the area of adhesion between sealing resin 1 and insulating substrate 41, more specifically, the area of adhesion between sealing resin 1 and first circuit board 31, in the vicinity of semiconductor element 2, is larger than that of semiconductor device 101 in the comparative example. Thus, the adhesion between sealing resin 1 and first circuit board 31 is improved, and a margin in which semiconductor device 100 can endure thermal stress is increased. As a result, the occurrence of peeling upon application of thermal stress can be suppressed in semiconductor device 100.

<Configuration and Functions and Effects of Variations>

Figure 6:
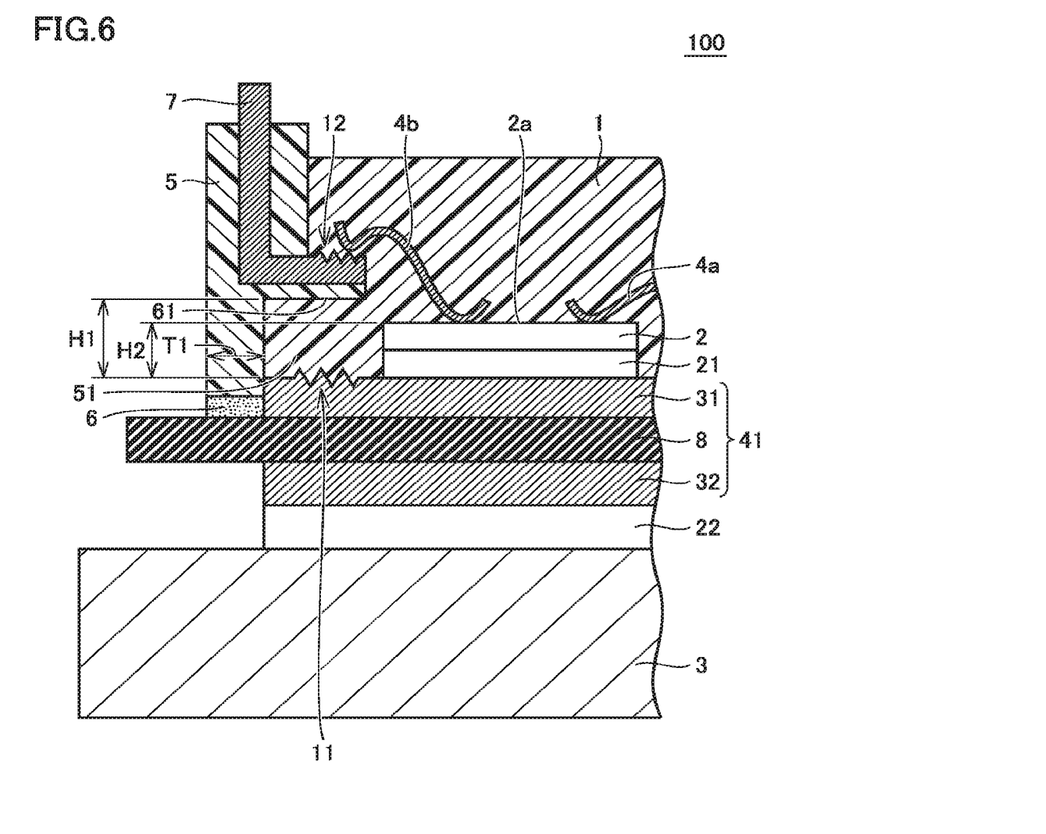
FIG. 6 is a schematic fragmentary cross-sectional view showing a first variation of the semiconductor device shown in FIG. 1.

FIG. 6 is a schematic fragmentary cross-sectional view showing a first variation of the semiconductor device shown in FIG. 1. Semiconductor device 100 shown in FIG. 6 is basically configured similarly to the semiconductor device shown in FIGS. 1 and 2, but is different from semiconductor device 100 shown in FIGS. 1 and 2 in the shape of electrode terminal 7 and first circuit board 31. That is, in semiconductor device 100 shown in FIG. 6, the surfaces of respective portions of electrode terminal 7 and first circuit board 31 that are in contact with sealing resin 1 are provided with irregularities portions 11, 12 including minor irregularities in order to improve the adhesion to sealing resin 1. Electrode terminal 7 is provided with irregularity portion 12 at a position adjacent to the connection portion connected to wiring member 4b. First circuit board 31 is provided with irregularity portion 11 in a region located within recess 51. Since such irregularity portions 11, 12 are formed, the adhesiveness between sealing resin 1 and electrode terminal 7 and between sealing resin 1 and first circuit board 31 is improved.

Figure 7:
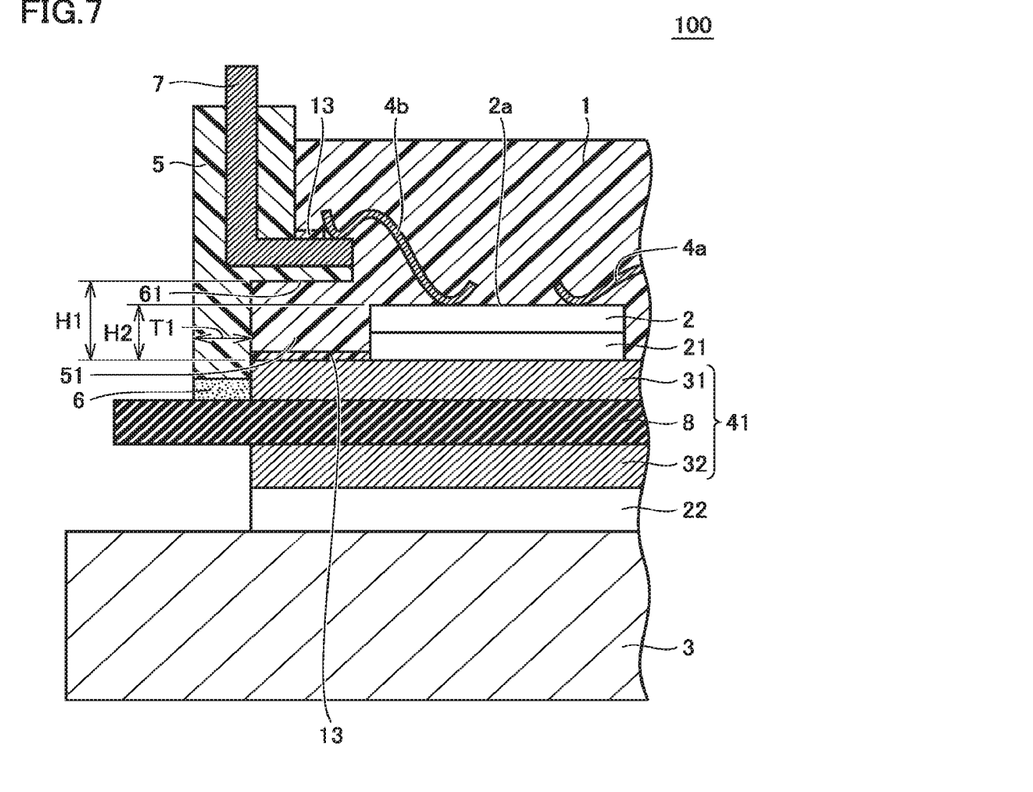
FIG. 7 is a schematic fragmentary cross-sectional view showing a second variation of the semiconductor device shown in FIG. 1.

FIG. 7 is a schematic fragmentary cross-sectional view showing a second variation of the semiconductor device shown in FIG. 1. Semiconductor device 100 shown in FIG. 7 is basically configured similarly to the semiconductor device shown in FIGS. 1 and 2, but is different from semiconductor device 100 shown in FIGS. 1 and 2 in that a surface-treated layer 13 is formed on part of the surface of each of electrode terminal 7 and first circuit board 31. That is, in semiconductor device 100 shown in FIG. 7, an adhesion enhancer layer is formed as surface-treated layer 13 on the surface of each of electrode terminal 7 and first circuit board 31 that is in contact with sealing resin 1. Electrode terminal 7 is provided with surface-treated layer 13 at a position adjacent to the connection portion connected to wiring member 4b. First circuit board 31 is provided with surface-treated layer 13 in a region located within recess 51. Surface-treated layer 13 is formed by applying an adhesion enhancer. Since such surface-treated layer 13 is formed, the adhesiveness between sealing resin 1 and electrode terminal 7 and between sealing resin 1 and first circuit board 31 is improved.

Surface-treated layer 13 may be formed by applying primer treatment and the like to the surface of each of electrode terminal 7 and first circuit board 31. A silane coupling agent, polyimide or epoxy resin can be used, for example, as the adhesion enhancer. Any material can be used as the adhesion enhancer as long as the adhesion between electrode terminal 7 and sealing resin 1 and between first circuit board 31 and sealing resin 1 is improved.

Second Embodiment

<Configuration of Semiconductor Device>

Figure 8:
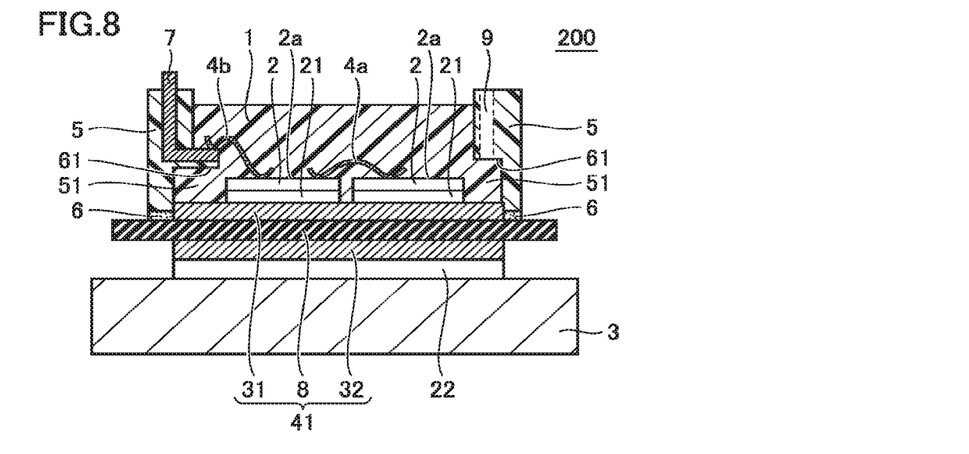
FIG. 8 is a schematic cross-sectional view of a semiconductor device according to a second embodiment of the present invention.

FIG. 8 is a schematic cross-sectional view showing a basic structure of a semiconductor device 200 according to a second embodiment of the present invention. The configuration of semiconductor device 200 according to the second embodiment of the present invention is described with reference to FIG. 8.

As shown in FIG. 8, semiconductor device 200 is basically configured similarly to the semiconductor device shown in FIGS. 1 and 2, but is different from semiconductor device 100 shown in FIGS. 1 and 2 in that it has a through hole 9 provided in case member 5. That is, semiconductor device 200 shown in FIG. 8 is provided with through hole 9 extending from inside recess 51 to an upper end of case member 5.

<Functions and Effects>

Figure 9:
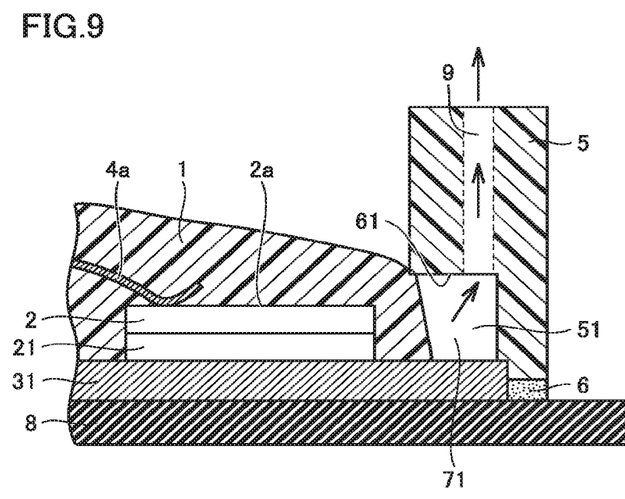
FIG. 9 is a schematic fragmentary cross-sectional view of the semiconductor device shown in FIG. 8.

Semiconductor device 200 shown in FIG. 8 can basically produce similar effects to those of semiconductor device 100 shown in FIG. 1. Further, in semiconductor device 200 shown in FIG. 8, through hole 9 provided in case member 5 extends through case member 5 from facing surface 61 of recess 51 to reach an upper surface of case member 5. Namely, case member 5 is provided with through hole 9 extending from inside recess 51 to a region of a surface of case member 5 other than recess 51. Since through hole 9 is formed, the filling of sealing resin 1 into recess 51 can be improved. This is explained using FIG. 9. FIG. 9 is a schematic fragmentary cross-sectional view in a manufacturing process of the semiconductor device shown in FIG. 8, for illustrating the effect of through hole 9 in this semiconductor device.

As shown in FIG. 9, during the filling of sealing resin 1 in semiconductor device 200, sealing resin 1 may make contact with case member 5 at a position higher than facing surface 61 of recess 51, such as when sealing resin 1 is not very fluid. In this case, an unfilled portion 71 in which sealing resin 1 is not disposed is generated in recess 51. If such unfilled portion 71 remains in recess 51 after sealing resin 1 has been cured, there is a risk that the insulation and peeling resistance of sealing resin 1 may decrease.

In semiconductor device 200 of the second embodiment, air space present in unfilled portion 71 may be discharged to the outside of semiconductor device 200 through through hole 9. Thus, when an inner peripheral side opening in recess 51 is closed with sealing resin 1 while unfilled portion 71 remains as shown in FIG. 9, the air space in unfilled portion 71 is discharged to the outside through through hole 9 as indicated by arrows in FIG. 9. Therefore, a flow of sealing resin 1 into recess 51 is not prevented by the air space. Accordingly, unfilled portion 71 is also filled with sealing resin 1, with the result that sealing resin 1 is disposed entirely in recess 51. The semiconductor device having high reliability can thus be provided.

<Configuration and Functions and Effects of Variations>

Figure 10:
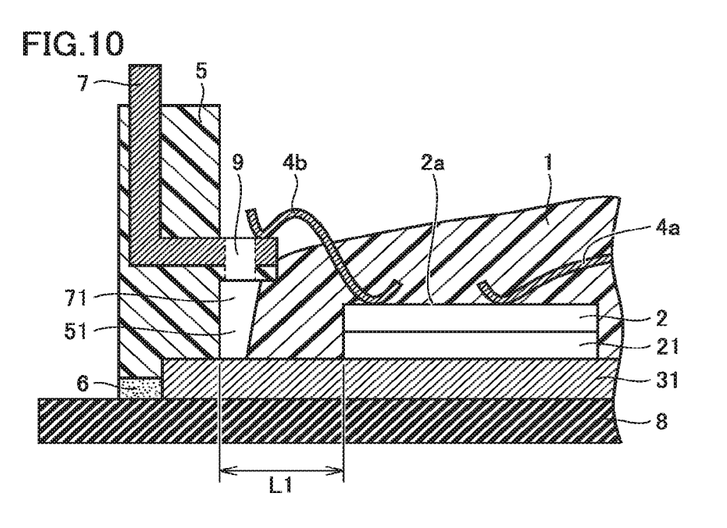
FIG. 10 is a schematic fragmentary cross-sectional view showing a first variation of the semiconductor device shown in FIG. 8.

Any shape can be employed for through hole 9 as long as the air space present in unfilled portion 71 within recess 51 can be discharged to the outside of recess 51. Through hole 9 does not necessarily need to be present from facing surface 61 to the upper side of case member 5 as shown in FIGS. 8 and 9. FIG. 10 is a schematic fragmentary cross-sectional view showing a first variation of the semiconductor device shown in FIG. 8, and is a schematic cross-sectional view showing another configuration example of through hole 9. FIG. 10 corresponds to FIG. 9, and shows the filling of sealing resin 1 in the space on the inner peripheral side of case member 5 in a manufacturing process of the semiconductor device.

The semiconductor device shown in FIG. 10 is basically configured similarly to the semiconductor device shown in FIGS. 8 and 9, but is different from the semiconductor device shown in FIGS. 8 and 9 in the configuration of through hole 9. That is, in the semiconductor device shown in FIG. 10, through hole 9 is formed to extend from recess 51 in case member 5 located below electrode terminal 7 to an upper surface of a protrusion of the inner surface of case member 5 in which electrode terminal 7 is partially disposed.

As shown in FIG. 10, recess 51 in the side of case member 5 in which electrode terminal 7 is mounted has greater distance L1 between the end of semiconductor element 2 and the inner wall of recess 51 in case member 5, than when recess 51 is formed in other sides. Thus, unfilled portion 71 tends to be formed in recess 51. By providing through hole 9 in the protrusion of the side of case member 5 in which electrode terminal 7 is disposed as shown in FIG. 10, therefore, the air can be released from inside recess 51 located below electrode terminal 7 to a space above the protrusion through through hole 9. Accordingly, the discharge of the air space present in unfilled portion 71 can be facilitated to fill recess 51 with sealing resin 1, as shown in FIG. 10.

Figure 11:
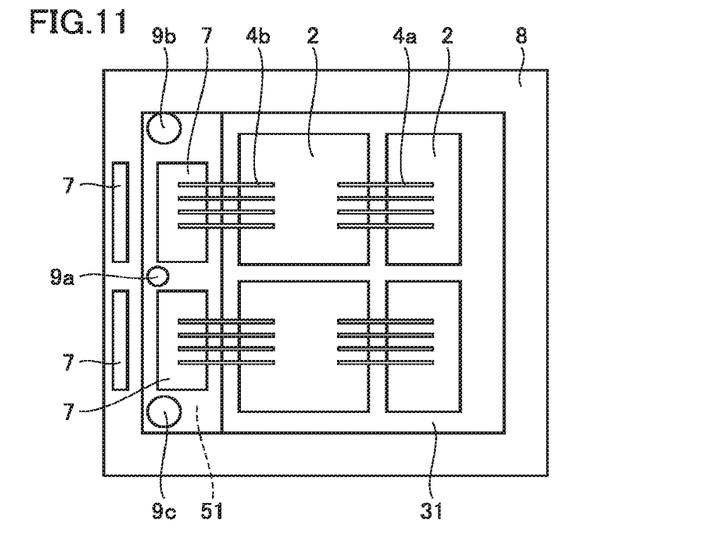
FIG. 11 is a schematic top view showing a second variation of the semiconductor device shown in FIG. 8.

Through hole 9 is preferably positioned where an unfilled portion tends to be generated in semiconductor device 200. FIG. 11 is a schematic top view showing a second variation of semiconductor device 200 in the present embodiment.

The semiconductor device shown in FIG. 11 is basically configured similarly to the semiconductor device shown in FIGS. 8 and 9, but is different from the semiconductor device shown in FIGS. 8 and 9 in the configuration of through hole 9. That is, in the semiconductor device shown in FIG. 11, a plurality of through holes 9a to 9c are formed in the side of case member 5 in which electrode terminals 7 are disposed. A plurality of electrode terminals 7 are disposed in this side of case member 5. The plurality of through holes 9a to 9c are disposed to sandwich electrode terminals 7 between them. In other words, the plurality of through holes 9a to 9c are disposed such that they are aligned with electrode terminals 7 in a direction in which this side extends. Through holes 9a to 9c may have the same diameter, or may have different diameters from one another. For example, as shown in FIG. 11, through holes 9b and 9c disposed in regions closer to the corners of case member 5 may have a greater diameter than through hole 9a disposed in a central portion of this side of case member 5. Unfilled portion 71 may tend to be generated at the corners of case member 5. The relatively large diameter of through holes 9b and 9c can allow the air to be exhausted more reliably from unfilled portion 71.

The location where unfilled portion 71 is generated depends on the arrangement of semiconductor element 2, wiring members 4 and the like. In a simple configuration, such as where the end face of semiconductor element 2 is substantially parallel to one side of case member 5, unfilled portion 71 generated at a location of initial impact of sealing resin 1 and case member 5 can be eliminated by arranging through hole 9a in a central portion of this one side of case member 5 as shown in FIG. 11. In addition, unfilled portions 71 generated at locations of final filling of sealing resin 1 can be eliminated by arranging through holes 9b and 9c at the corners of case member 5. When arranging through hole 9a in a central portion of one side of case member 5, through hole 9a is preferably positioned at some distance from electrode terminal 7 so as to prevent interference with electrode terminal 7.

Third Embodiment

<Configuration of Semiconductor Device>

Figure 12:
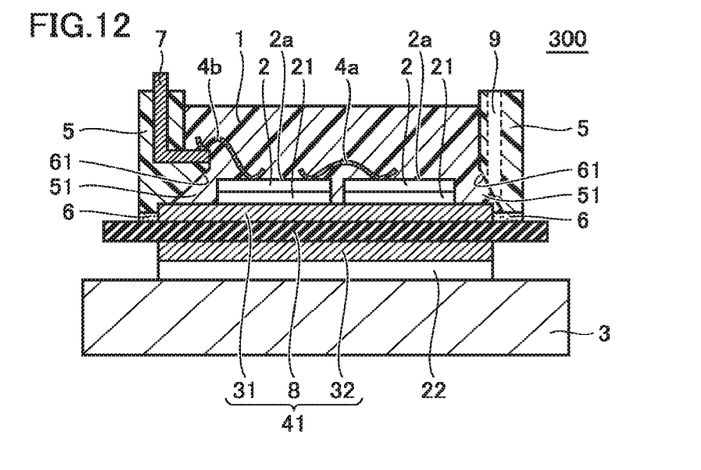
FIG. 12 is a schematic cross-sectional view of a semiconductor device according to a third embodiment of the present invention.

FIG. 12 is a schematic cross-sectional view showing a basic structure of a semiconductor device 300 according to a third embodiment of the present invention. The configuration of semiconductor device 300 according to the third embodiment of the present invention is described with reference to FIG. 12.

As shown in FIG. 12, semiconductor device 300 is basically configured similarly to semiconductor device 200 shown in FIG. 8, but is different from semiconductor device 200 shown in FIG. 8 in the shape of the inner wall of recess 51. That is, in semiconductor device 300 shown in FIG. 12, facing surface 61 of recess 51 facing insulating substrate 41 is inclined relative to the front surface of insulating layer 8 or the surface of first circuit board 31. In other words, facing surface 61 of recess 51 is a surface inclined such that its distance from insulating layer 8 or first circuit board 31 increases gradually from the end on the outer peripheral side to the end on the inner peripheral side of case member 5. Through hole 9 is formed to extend from a midway portion of facing surface 61, which is this inclined surface, to the upper surface of case member 5.

<Functions and Effects>

Semiconductor device 300 shown in FIG. 12 can basically produce similar effects to those of the semiconductor device shown in FIG. 8. In addition, in semiconductor device 300 shown in FIG. 12, facing surface 61 of recess 51 as the inner wall portion that faces first circuit board 31 is a plane inclined relative to the main surface of insulating substrate 41 (the surface of first circuit board 31, for example). Thus, unfilled portion 71 generated in recess 51 tends to be discharged to the outside of recess 51 along facing surface 61. As a result, the possibility of unfilled portion 71 remaining in recess 51 can be reduced, and the semiconductor device having high reliability can be provided.

Figure 13:
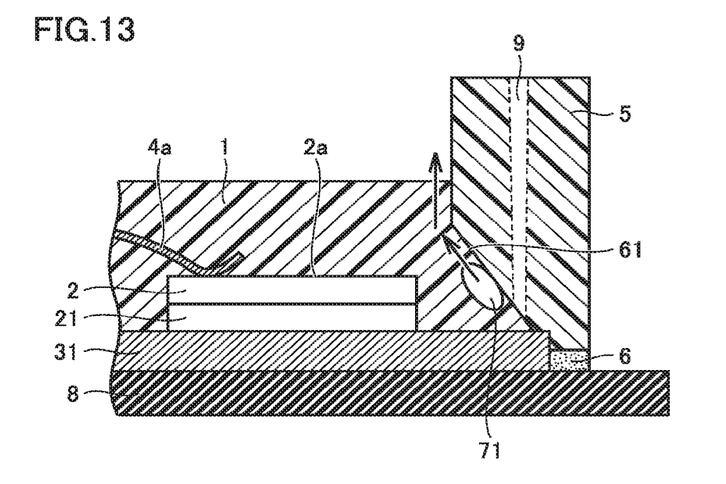
FIG. 13 is a schematic fragmentary cross-sectional view of the semiconductor device shown in FIG. 12.

The effects of semiconductor device 300 shown in FIG. 12 are described in more detail with reference to FIG. 13. FIG. 13 is a schematic fragmentary cross-sectional view of semiconductor device 300 shown in FIG. 12, which shows one step in a manufacturing process of semiconductor device 300 shown in FIG. 12. FIG. 13 corresponds to FIG. 9.

In the semiconductor device shown in FIG. 13, facing surface 61 of the recess is an inclined surface. Therefore, unfilled portion 71 generated in recess 51 (see FIG. 12) during the sealing with sealing resin 1 can readily move upward along facing surface 61 which is an inclined surface. Accordingly, unfilled portion 71 is discharged to the outside of semiconductor device 300 from an upper surface of sealing resin 1. In contrast, when facing surface 61 is parallel to the surface of first circuit board 31, unfilled portion 71 generated during the filling of sealing resin 1 cannot move from inside recess 51 if the air inside unfilled portion 71 cannot be exhausted through through hole 9. There may thus be a possibility of unfilled portion 71 remaining in recess 51. Such possibility can be reduced in semiconductor device 300 shown in FIG. 12.

<Configuration and Functions and Effects of Variation>

Figure 14:
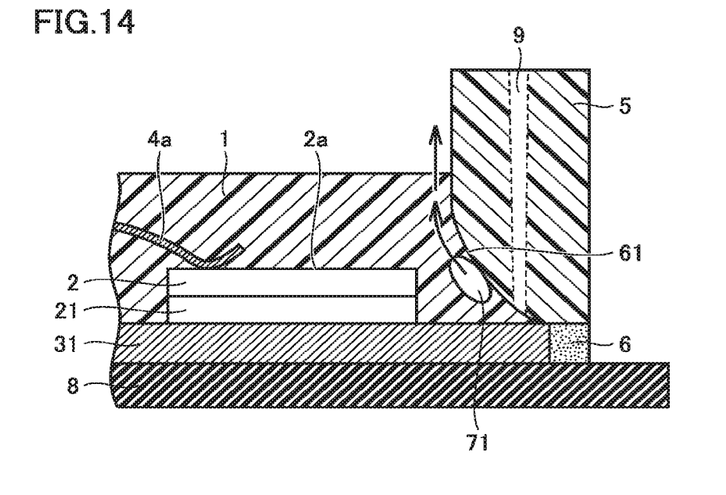
FIG. 14 is a schematic fragmentary cross-sectional view showing a variation of the semiconductor device shown in FIG. 12.

FIG. 14 is a schematic fragmentary cross-sectional view showing a variation of semiconductor device 300 shown in FIG. 12. The configuration of a semiconductor device according to the variation of the third embodiment of the present invention is described with reference to FIG. 14. FIG. 14 corresponds to FIG. 13.

The semiconductor device shown in FIG. 14 is basically configured similarly to semiconductor device 300 shown in FIG. 12, but is different from semiconductor device 300 shown in FIG. 12 in the shape of the inner wall of recess 51 (see FIG. 12). That is, in the semiconductor device shown in FIG. 14, facing surface 61 of recess 51 (see FIG. 12) facing insulating substrate 41 is curved while being inclined relative to the front surface of insulating layer 8 or the surface of first circuit board 31. In other words, in the semiconductor device shown in FIG. 14, facing surface 61 is convexly curved toward insulating substrate 41. The distance of facing surface 61 from the front surface of insulating layer 8 or the surface of first circuit board 31 increases gradually from the outer peripheral surface side to the inner peripheral surface side of case member 5. Facing surface 61 is arc-shaped in cross section in FIG. 14. Through hole 9 is formed to extend from curved facing surface 61 to the upper surface of case member 5.

The semiconductor device shown in FIG. 14 can produce similar effects to those of semiconductor device 300 shown in FIG. 12.

The configurations of the above-described respective embodiments may be combined as appropriate. For example, the structure shown in FIG. 6 or 7 may be applied to semiconductor devices 200 or 300 according to the second embodiment or the third embodiment. The structure shown in FIG. 10 or 11 may be applied to semiconductor device 300 according to the third embodiment.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 sealing resin; 2 semiconductor element; 2a upper surface; 3 metal base plate; 4a, 4b wiring member; 5 case member; 6 adhesive; 7 electrode terminal; 8 insulating layer; 9, 9a, 9b, 9c through hole; 10 peeled portion; 11, 12 irregularity portion; 13 surface-treated layer; 14 positioning member; 21 first joining material; 22 second joining material; 31 first circuit board; 32 second circuit board; 41 insulating substrate; 51 recess; 61 facing surface; 71 unfilled portion; 100, 101, 200, 300 semiconductor device.

The invention claimed is:

1. A semiconductor device comprising:
an insulating substrate having a main surface;
a semiconductor element disposed on the main surface of the insulating substrate;
a case member surrounding the semiconductor element and connected to the insulating substrate;
a sealing material that is disposed in an internal region surrounded by the case member and the insulating substrate, and that surrounds the semiconductor element; and
an electrode terminal that is connected to the semiconductor element, and that is formed integrally with the case member,
the case member including a recess that is continuous with a connection portion of the case member connected to the insulating substrate, and that faces the internal region,
the recess including an inner wall portion facing the main surface of the insulating substrate,
the inner wall portion having an end on an outer peripheral side to an end on an inner peripheral side of the case member,
the electrode terminal having a first portion extending in a direction along the main surface of the insulating substrate and a second portion extending in a vertical direction intersecting the first portion,
a distance from the main surface of the insulating substrate to the end on the inner peripheral side of the inner wall portion being greater than a distance from the main surface to an upper surface of the semiconductor element, and
the inner wall portion being disposed between the first portion and the main surface.

2. The semiconductor device according to claim 1, wherein
the case member is provided with a through hole extending from inside the recess to a region of a surface of the case member other than the recess.

3. The semiconductor device according to claim 2, wherein
the inner wall portion is parallel to the main surface of the insulating substrate.

4. The semiconductor device according to claim 2, wherein
the inner wall portion is inclined relative to the main surface of the insulating substrate such that a distance of the inner wall portion from the main surface of the insulating substrate increases gradually from the end on the outer peripheral side to the end on the inner peripheral side.

5. The semiconductor device according to claim 1, wherein
the inner wall portion is parallel to the main surface of the insulating substrate.

6. The semiconductor device according to claim 1, wherein
the inner wall portion is inclined relative to the main surface of the insulating substrate such that a distance of the inner wall portion from the main surface of the insulating substrate increases gradually from the end on the outer peripheral side to the end on the inner peripheral side.

7. The semiconductor device according to claim 6, wherein
the inner wall portion has a curved surface between the end on the outer peripheral side and the end on the inner peripheral side.

8. The semiconductor device according to claim 1, wherein
the case member is provided with the recess in a region having a shortest distance to the semiconductor element.

9. The semiconductor device according to claim 1, wherein
the case member is fixed to the insulating substrate.

10. The semiconductor device according to claim 1, wherein
the sealing material includes epoxy resin or silicone resin.

* * * * *